Figure 1:
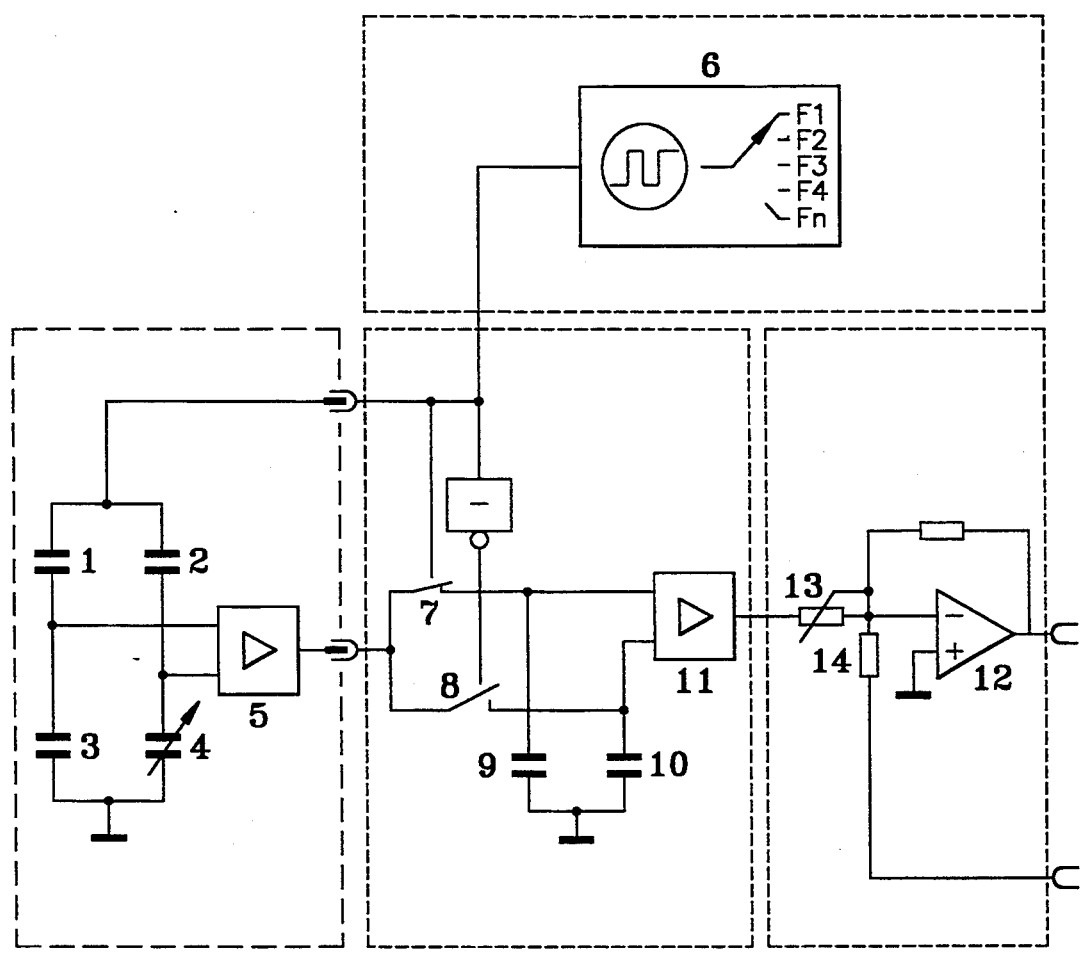

United States Patent [19]

Meinen

[11] Patent Number: 5,412,327
[45] Date of Patent: May 2, 1995

[54] DISTANCE SENSOR UTILIZING A BRIDGE CIRCUIT INCORPORATING VARIABLE CAPACITANCES

[76] Inventor: Michael Meinen, 7 Rosenstrasse, Nordstemmen, Germany, 34471

[21] Appl. No.: 124,277
[22] Filed: Sep. 20, 1993
[51] Int. Cl.⁶ .............. G01R 27/26; H01G 7/00; G01B 7/14
[52] U.S. Cl. .................... 324/686; 324/680; 324/690; 324/725; 361/277; 361/280
[58] Field of Search ........... 324/658, 686, 687, 690, 324/725; 361/277, 278, 280, 283.1, 313, 763

[56] References Cited

U.S. PATENT DOCUMENTS

| | | | |
|---|---|---|---|
| 3,678,378 | 7/1972 | Trott et al. | 361/278 X |
| 4,342,143 | 8/1982 | Jennings | 361/313 X |
| 4,466,045 | 8/1984 | Coleman | 361/277 |
| 4,470,096 | 9/1984 | Guertin | 361/277 |

FOREIGN PATENT DOCUMENTS 3134342  8/1981  Germany.

*Primary Examiner*—Gerard R. Strecker
*Assistant Examiner*—Diep Do
*Attorney, Agent, or Firm*—Roger D. Emerson

[57] ABSTRACT

A capacitive sensor contains a bridge circuit (1,2,3,4) which is comprised of an electrode surface (21) and a reference electrode surface (24) with the electrode surfaces located on the opposite sides of a plate. The bridge circuit is constructed as a multi-layered printed circuit board. The feed areas (23) which are opposite the electrode areas (21, 24) on one or two inner layers serve as feed capacitors (1, 2) in the bridge circuit (1, 2, 3, 4).

10 Claims, 4 Drawing Sheets

DISTANCE SENSOR UTILIZING A BRIDGE CIRCUIT INCORPORATING VARIABLE CAPACITANCES

The invention refers to a capacitive sensor, especially for distance measurements. A bridge circuit in which one of the bridge elements is a variable capacitance is suitable for the construction of a capacitive sensor. As sensor means/element),an electrode formed by an area is, for example, brought towards the object, to which the distance is to be measured. The capacity of the electrode to its surrounding is dependent on the medium which is in the proximity of the electrode. When the object is not in proximity, the air with its relatively low dielectric constant is determining the capacitance of the electrode to its surrounding. If, in contrast, an object, e.g. an article or a surface with a higher dielectric constant, is placed close to the electrode, the capacitance increases and the symmetry of the bridge circuit is out of balance. This unbalance can be used to derive a data signal.

This type of capacitative sensor based on a bridge circuit is known from patent DE 31 34 342 C2. Two electrode arrangements are provided for the bridge circuit. The one electrode arrangement represents the variable capacitance element of the sensor and is placed on the outside of the sensor housing. The second electrode arrangement serves as a reference for the compensation of environmental effects and is placed on the inside of the sensor housing. In the known sensor, a single non-conducting plate with metal coating on both sides is utilized for the placement of the electrodes. Thus a close thermal coupling of the electrode arrangements is established. Thus temperature variations affect both electrode arrangements equally and their effects are thus eliminated. The use of a single non-conducting plate is possible because the electrodes are arranged off-set with respect to each other. The electrode arrangements can thus not influence each other electrically. Discrete components are used in the known sensor for the other capacitances of the bridge circuit via these components an alternating voltage is entered to the bridge circuit. Discrete capacitors exhibit high tolerances in the values of the capacitances used in this application. This makes the calibration of the bridge circuit difficult.

The purpose of the invention is to improve the known sensor.

This task is solved by the invention listed in claim 1.

The following improvements are achieved in the sensor in this invention:

An overlapping of the electrode areas is possible since the feed areas are located in between the electrode areas. Thus one has more freedom with the formation of the sensor electrode.

In comparison to the known arrangement, a considerably higher sensitivity for the bridge circuit is obtained since disturbing capacitative coupling to the area masses is eliminated.

It is possible to form the feed area so that the symmetry of the bridge is easily established. Considerably lower tolerances for the feed capacitances can be maintained than is possible with discreet circuit elements.

The latter is especially true when, according to a embodiment example of the invention, the multi-layer printed circuit board is composed of two bi-layered printed circuit boards and the same material is used for both printed circuit boards. In this case capacitance variations in the bridge circuit caused by thickness variations of the base material are eliminated. The capacitances are then only dependent on the areas in the layout of the printed circuit board.

In the following the invention is explained using an embodiment example which is depicted in the drawing.

Figure 2:
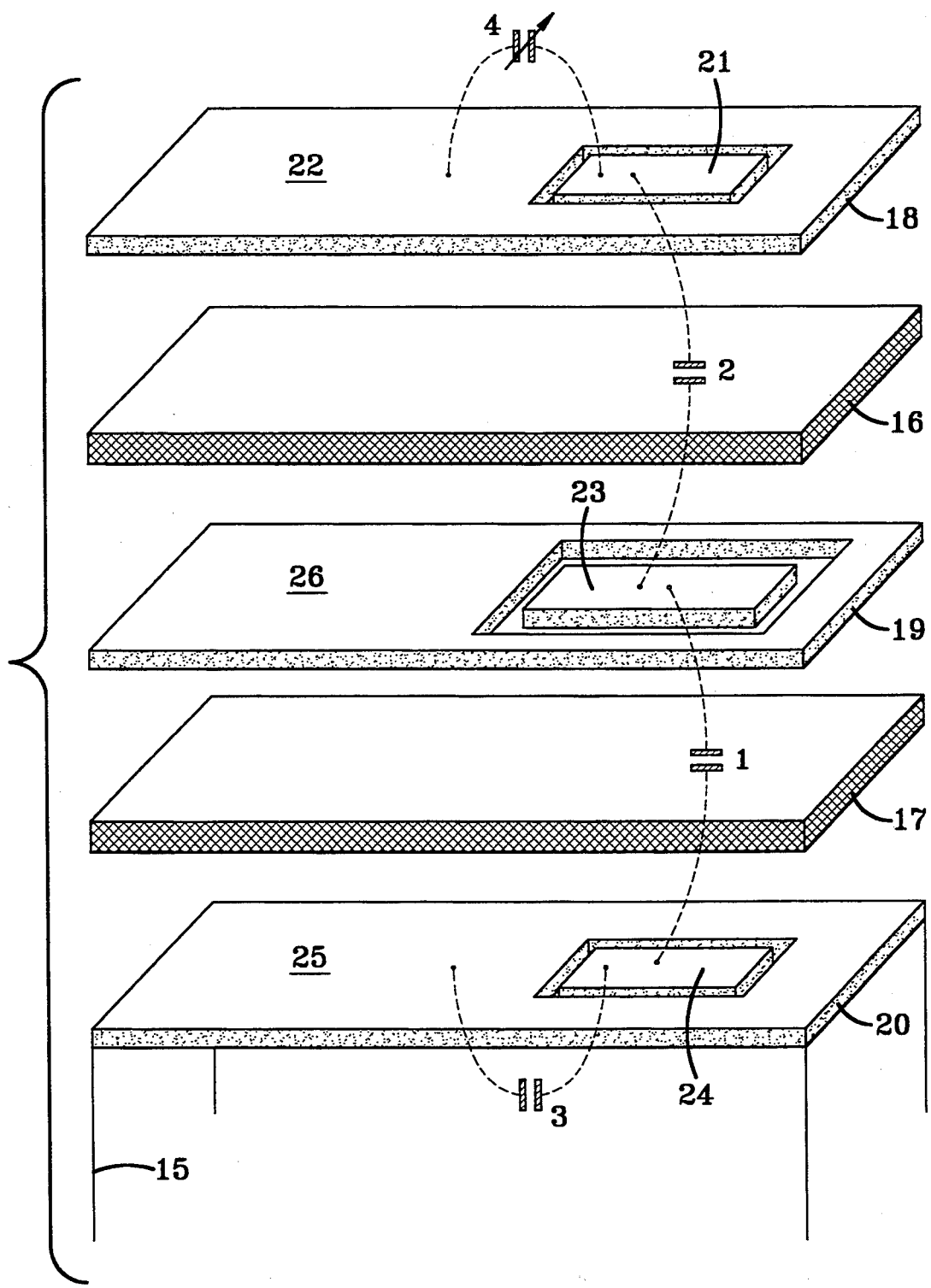
Figure 3:
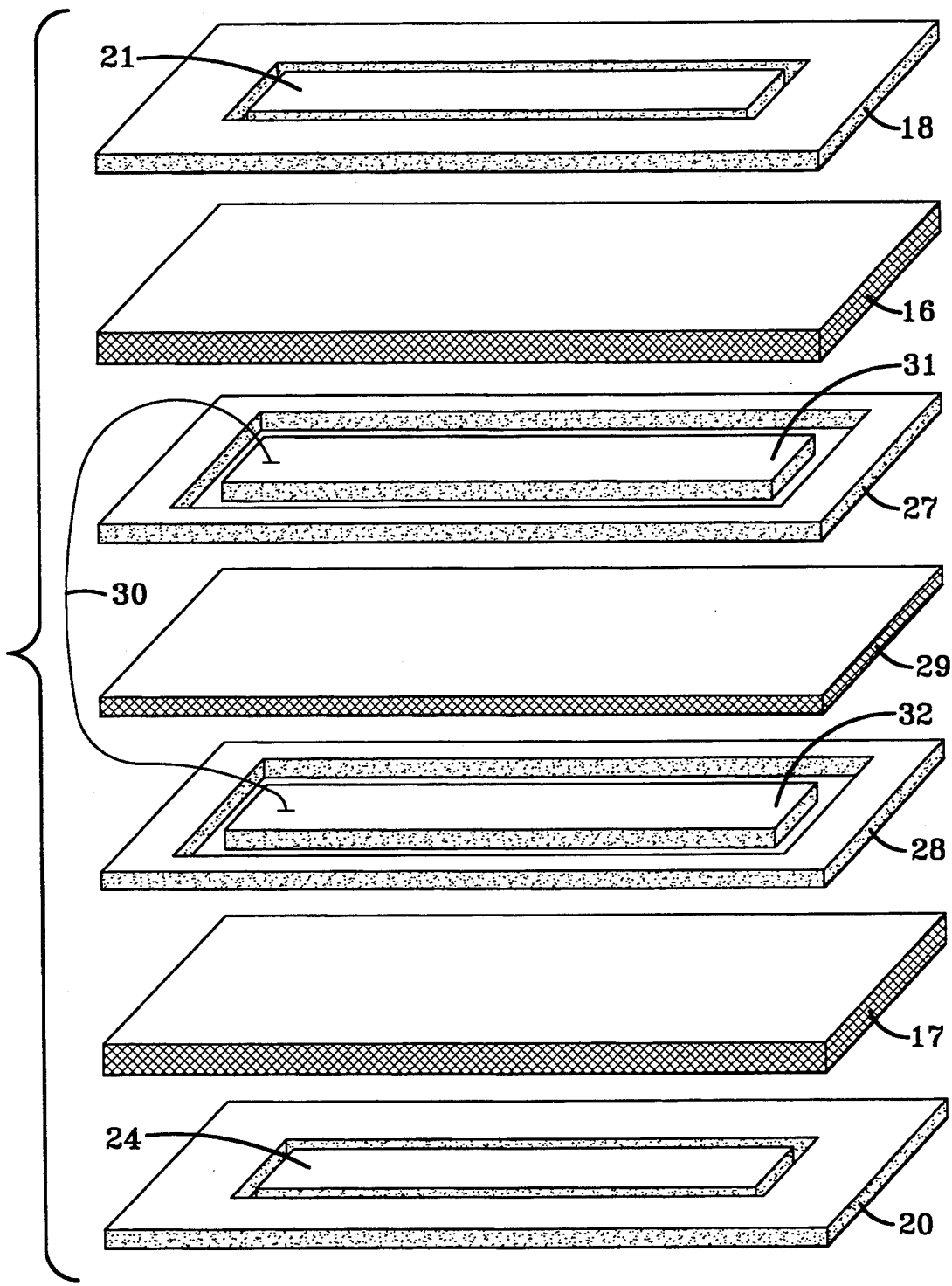
Figure 4:
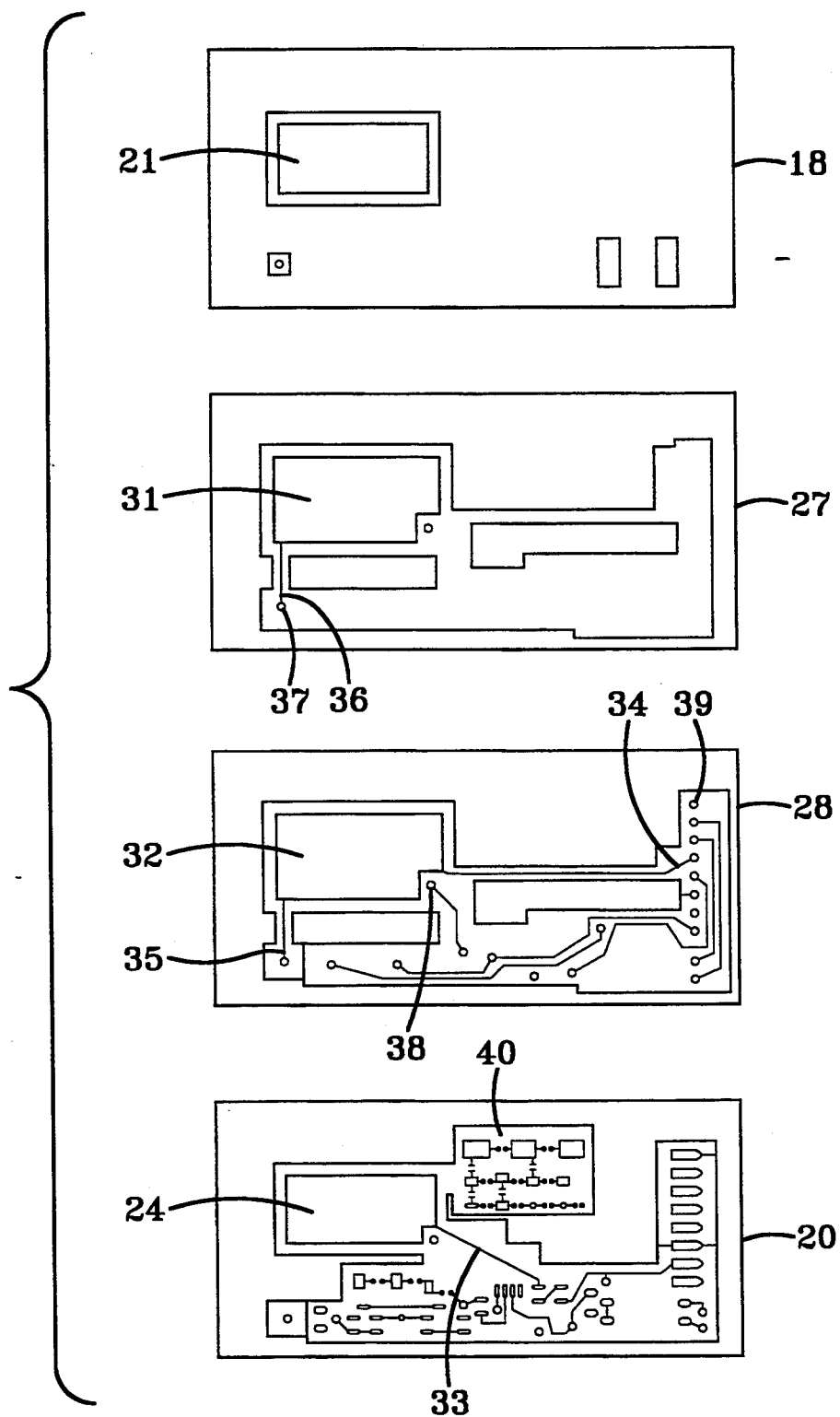

The following figures show:

FIG. 1 the circuit of a capacitative distance sensor with a bridge circuit,

FIG. 2 an embodiment example of an electrode arrangement in a distance sensor with characteristics according to the invention, FIG. 3 another embodiment example and FIG. 4 practical realized layout with the characteristics according to the invention.

The circuit diagram of a capacitative distance sensor is depicted in FIG. 1. A bridge circuit is provided with the feed capacitances 1 and 2 in the upper part of the bridge and a variable capacitance 4 and a reference capacitance 3 in the lower part of the bridge. The bridge circuit is fed by an oscillator 6 with square wave AC. The output signal of the bridge circuit is amplified in a difference amplifier. A square wave signal is available at the output of the difference amplifier 5, the amplitude of which is dependent on the imbalance of the bridge. The output signal of the difference amplifier 5 is subsequently rectified in the synchronous rectifier. The function of the synchronous rectifier is indicated by two switches 7 and 8 which are activated, inverted to each other, by the signal from the oscillator 6. Charge capacitors 9 and 10 are assigned to the switches 7 and 8.

The positive signal level of the output signal will form on one of the capacitors 9,10, on the other one the negative one. The difference between these two levels is formed by a difference amplifier 11. A DC signal is found at the output of the difference amplifier 11 which is a measure for the imbalance of the bridge 1-4. This signal is conditioned with a signal conditioning circuit using an operational amplifier 12. The output signal of the difference amplifier 11 is amplified in the signal conditioning circuit. The level of this magnification can be adjusted with the help of a potentiometer 13. Furthermore, an offset voltage (control voltage) can be added with the help of resistor 14. The error voltages arising from the circuit components can be compensated for with this offset voltage.

The oscillator 6 of the circuit in FIG. 1 can be adjusted to different frequencies so that several sensors which are operated in parallel will not interfere with each other. It is shown in FIG. 2 how the bridge circuit is realized in conjunction with a multi-layered printed circuit board. The multi-layered printed circuit board represents one wall of the housing 15 of a capacitative distance sensor. It is constructed with two non-conducting plates of equal thickness 16 and 17 and three copper layers 18, 19 and 20. An electrode area is etched away in copper layer 18. The electrode area 21 has a capacitance with respect to the area 22 of the copper area 18 surrounding it, which will change when an object to be measured is approaching. This capacitance represents the variable element 4 in the bridge circuit. The copper layer 20 on the opposite outer side of the multi-layered printed circuit board exhibits an electrode area 24 which is constructed identically to electrode area 21. This is the reference electrode which is not accessible by the object to be measured and is located inside the sensor. A reference capacitance 3 is formed between electrode area 24 and the area 25 surrounding it. A feed area 23 is etched away opposite the electrode areas 21 and 24 in an inner layer of the multi-layered printed circuit board with the copper area 19. This feed area 23 is connected electrically with the output of the oscillator 6 in FIG. 1. The feed area 23 is coupled capacitively across the insulating plate 16 with the electrode area 21. Thus the feed capacitance 2 is formed. On the other side the feed area 23 is coupled with the electrode area 24 across the insulating plate 17 whereby the feed capacitance 1 is formed. The areas which surround the electrode areas 21 and 24 and the feed area 23, these are the areas 22, 25, and 26, are connected to circuit ground. The feed area 23 is larger than the electrode areas 21 and 24 in the depicted example. This results in the fact that the capacitive loading of electrode areas 21 and 24 with respect to circuit ground is kept very low. Parasitical capacitances which would reduce the sensitivity of the bridge circuit are thus kept very low.

As in FIG. 2, the electrode areas 21 and 24 each have capacitance with respect to the copper area 18, 20 surrounding it, thus forming capacitors 4 and 3 respectively. Likewise, feed areas 31 and 32 are respectively coupled capacitively across isolation plates 16 and 17 to form capacitors 1 and 2.

An exploded view of the layers of the multi-layered printed circuit board is given in FIG. 2 in order to be able to demonstrate better the construction of the single layers. In reality the layers are pressed together closely so that they are joined together without the presence of air. For the same reason the depicted thickness of the layers does not correspond to reality. In a realistic embodiment, the isolation plates 16 and 17 are 1.1 mm and the copper layers 0.35 mm thick.

In FIG. 3 a multi-layer printed circuit board is depicted which is joined together from two bi-layer printed circuit boards. The parts of the printed circuit board which correspond to the diagram in FIG. 2 are identified by the same reference numbers. The isolation plate 16 with the copper layers 18 and 27 forms the one printed circuit board and the isolation plate 17 with the copper layers 28 and 20 the other one. The electrode areas 21 and 24 have each their own feed areas 31 and 32 respectively. The feed areas are electrically connected with each other via conductor 30. The two bi-layered printed circuit boards are bonded together with the help of an adhesive layer 29. This arrangement has the advantage according to FIG. 3, that the same material can be utilized for both halves of the printed circuit board, so that the thickness variations of the printed circuit boards with respect to each other can be kept relatively low.

In the depicted examples according to FIG. 2 and FIG. 3, the feed areas are in both cases larger than the electrode areas. Thereby the capacitance of the electrode areas with respect to ground are kept low, whereby one achieves a maximal sensitivity of the bridge arrangement. However, it is also possible to make the feed areas smaller than the electrode areas and to identify and design the other part as grounded area. Thereby the properties of the bridge circuit can be predetermined over a wide range.

Another interesting point shall be mentioned which has to be considered in the design of the bridge circuit of the multi-layered printed circuit board. Reference is made to FIG. 2. In practical applications, sensors with electrode areas 21 or 24 of varying size are needed. When area 21 is enlarged, so is the value of capacitance 4. When the feed area 23 is also enlarged, the value of the capacitance 2 is enlarged by the same amount. The same applies to the capacitances 3 and 1. This means that the ratio of the series circuit formed by the capacitances 2 and 4 remains the same. Only the impedance of the bridge circuit legs will decrease. Thus the output voltage of the bridge circuit is independent of the size of the electrode area and the feed area. It follows that the connected amplifier circuit can be utilized for all different sensor types.

In FIG. 4 the embodiment of a practical layout for a multi-layer printed circuit board is shown. The construction corresponds to the one shown in FIG. 3. The corresponding areas are also designated by the same numbers. Only the copper areas of the two printed circuit boards from which the multi-layer printed circuit board is constructed are shown. The copper layers 18 and 27 are the sides of the one bi-layered printed circuit board and the layers 28 and 20 those of the other one. The two bi-layered printed circuit boards are manufactured separately. The printed circuit board with the layers 28 and 20 is equipped with a circuit for the amplification of the bridge output signals and carries therefore a series of conductor traces.

Several plate-through holes are also provided which are required for the construction of the layout. These holes are only in the printed circuit boards with the layers 28 and 20. Only the details which are necessary for the understanding of the bridge circuit are described here: One conductor trace 33 connects the reference electrode 24 with the circuit and a conductor trace 34 connects the oscillator signal to the feed area 32.

The printed circuit board with the layers 18 and 27 has initially no drilled holes. Both pre-fabricated boards are pressed together with an insulating inter-layer plate (see 29 in FIG. 3) and are combined into a multi-layer printed circuit board. As inter-layer, for example, an epoxy resin layer is used which hardens only when the printed circuit boards are pressed together under the application of heat.

The multi-layer printed circuit board thus formed contains three drilled holes 37, 38 and 39, which will then be plated through, so that also the inner layers 27 and 28 are connected to the plate-throughs. This is a frequently applied method in the multi-layer technology. Thereby feed area 32 is connected by drill hole 37 and via traces 35 and 36 to feed area 31. Also, the electrode area 21 is connected by drill hole 38 with the circuit, and finally, by drill hole 39 (not visible, since it lays in the black field) all grounded areas with each other and to circuit ground.

Areas 40 and 41 are provided on layer 20 which can be connected via soldering connections with the electrode area 24 or 21 respectively. The areas 40 and 41 are opposite a grounded area of the neighboring layer 28. The soldering connections provide for a final balancing of the bridge circuit. It has been observed, however, that a piece of connector trace of, for example, 1 cm length is better suited for fine tuning than the areas 40 and 41 (not shown). These conductor traces can be connected permanently to the electrode areas. Depending on the direction of the bridge imbalance, one or the other conductor trace can be shortened with the help of a small grinding tool. During this tuning procedure the output signal of the bridge circuit can be observed, for example, on an oscilloscope.

It shall also be pointed out, that capacitive sensors of the kind described can also be utilized to measure other quantities, for example the humidity in front of the electrode area used as a sensor.

I claim:

1. A capacitive sensor for use in determining the distance to an object, the sensor comprising:
   a capacitance bridge circuit carried by a printed circuit board; the printed circuit board having a first layer, a second layer and at least one inner layer therebetween;
   an electrode area etched on the first layer and forming a capacitance between the electrode area and a conductive surface of the first layer which varies proportionally with the distance between the electrode area of the first layer and the object;
   an electrode area etched on the second layer and forming a reference capacitance between the electrode area and a conductive surface of the second layer;
   a feed area etched on at least one inner layer, a feed area being disposed opposite of and electrically insulated from, an electrode area while being capacitively coupled thereto, the feed area being adapted for coupling to an oscillator; and
   wherein each electrode area generates a signal, the difference therebetween being a measure of the imbalance of the bridge circuit.

2. A capacitive sensor according to claim 1, wherein the feed area is larger than the opposing electrode area and extends beyond it on all sides.

3. A capacitive sensor according to claim 1, wherein the inner layer includes two conducting layers and each having a feed area thereon such that one feed area corresponds to an electrode area of the first layer and one feed area corresponds to an electrode area of the second layer and wherein the feed areas are electrically coupled together.

4. A capacitive sensor according to claim 3, wherein the electrode areas are coupled to a means for amplification of the signals.

5. A capacitive sensor according to claim 3, wherein the circuit board is fabricated by the joining of two 2-layer printed circuit boards together, one 2-layer board including the first layer and an inner layer and one 2-layer board including the second layer and an inner layer; and wherein the same base material is used for both 2-layered boards.

6. A capacitive sensor according to claim 3, wherein the electrode areas to each other, as well as the feed areas to each other, are of identical area and shape.

7. A capacitive sensor according to claim 2, wherein the circuit board includes four conducting layers and is fabricated by the joining of two 2-layer printed circuit boards and that a feed area each is provided for the corresponding electrode area on the 2-layered printed circuit boards.

8. A capacitive sensor according to claim 5, wherein the same base material is used for both 2-layered printed circuit boards.

9. A capacitive sensor according to claim 4, wherein the electrode areas to each other, as well as the feed areas to each other, are of identical area and shape.

10. A capacitive sensor according to claim 5, wherein the electrode areas to each other, as well as the feed areas to each other, are of identical area and shape.

* * * * *